United States Patent [19]

Brandes

[11] Patent Number: 4,727,547
[45] Date of Patent: Feb. 23, 1988

[54] METHOD AND APPARATUS FOR DECODING

[75] Inventor: Claudia Brandes, Rümlang, Switzerland

[73] Assignee: Willi Studer, Regensdorf, Switzerland

[21] Appl. No.: 753,255

[22] Filed: Jul. 9, 1985

[30] Foreign Application Priority Data

Jul. 18, 1984 [CH] Switzerland .................. 3508/84

[51] Int. Cl.⁴ .............................................. G06F 11/10
[52] U.S. Cl. ....................................... 371/38; 371/39; 371/44
[58] Field of Search .................. 371/39, 38, 37, 44, 371/45, 40

[56] References Cited

U.S. PATENT DOCUMENTS

| | | | |
|---|---|---|---|
| 4,532,629 | 7/1985 | Furuya | 371/39 |
| 4,541,092 | 9/1985 | Sako | 371/39 |
| 4,546,474 | 10/1985 | Sako | 371/39 |
| 4,593,394 | 6/1986 | Tominitsu | 371/39 |
| 4,606,026 | 8/1986 | Baggen | 371/39 |

OTHER PUBLICATIONS

Doi et al., A Format of Stationary-Head Digital Audio Recorder Covering Wide Range of Application, 1980, Audio Engineering Society Convention, New York.

Doi, A Design of Professional Digital Audio Recorder, 1982 Audio Engineering Society Convention, New York.

Primary Examiner—Michael R. Fleming
Attorney, Agent, or Firm—Helfgott & Karas

[57] ABSTRACT

Method and apparatus for transforming a first sequence of digital data and correction words having a first ordering thereof wherein blocks of data and correction words in the first ordering are formed out of the first sequence. Data and correction words are selected from first sequence and are combined in such manner as to form a second sequence with a second ordering. First and second groups of data and correction words are selected out of the second sequence. The first and second groups have one comon word which also belongs in one of the blocks. The data groups have one common word which also belongs in one of the blocks. The data words of the first and second groups are submitted simultaneously to a checking operation. The results of this operation are evaluated to decide if erroneous data words can be corrected. The second sequence of words is corrected using the correction words indicated by the evaluation.

26 Claims, 15 Drawing Figures

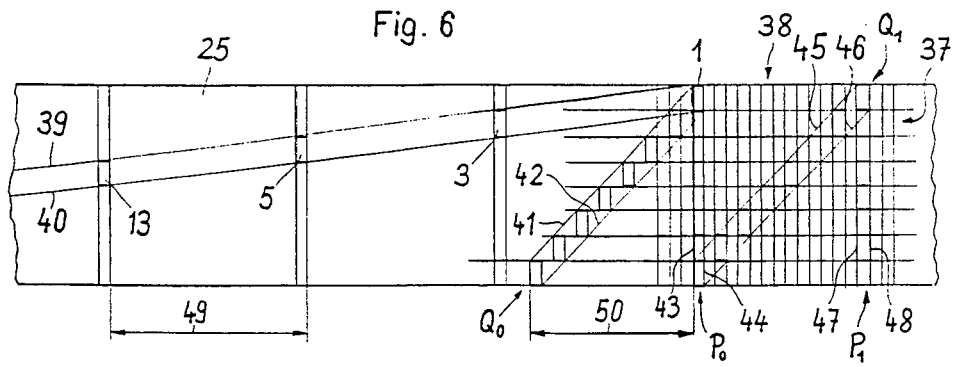
Fig. 6
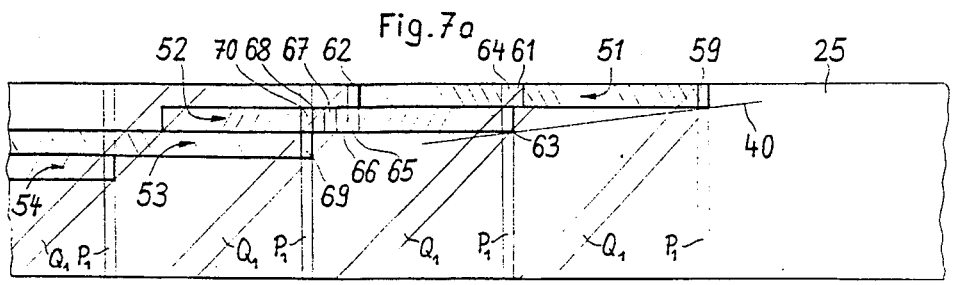
Fig. 7a
Fig. 8

METHOD AND APPARATUS FOR DECODING

BACKGROUND OF THE INVENTION

The invention relates to a method and an apparatus for recombining a first sequence of a digital data words occuring in a first ordering together with correction words into a second sequence of digital data words occuring in a second ordering, in which a given number of data words and correction words compose blocks.

Such methods and implementations are used in particular in the reproduction of digitally recorded audio signals on a recording medium. It is common practice to digitize originally analog signals for their recording on a recording medium. This means that the signal then consists of a sequence of data words, each of which representing a sample, for example the instantaneous value of the voltage of an originally analog signal. In order to protect the recorded data words, i.e. in order to prevent that these data words are modified and in order to prevent that several consecutive data words are destroyed at the same time, the sequence of data words is coded prior to the recording according to well-known methods. In the coding process, the original sequence of the data words is modified according to the rules of a code, and additional correction words are added. The sequence of the data words in this operation is modified in such a way that data words which were originally consecutive are separated by some distance and that other data words are placed between them. The correction words make it possible to correct and thus preserve one or several of the data words in a group. The coding of the data words makes it possible to protect the recordings from disturbances caused by dust, damage of the recording medium, cuts in the case of a tape recording, editing operations etc. In the process of reproducing the recorded data words, these must be decoded according to the rules of the same code. In the decoding process, the original sequence of the data words is reconstructed. Efficient use of the correction words which have been added during the recording process makes it possible to reduce the effects of the above-mentioned perturbations, so that the original digital signal can be reproduced with as few errors as possible.

Such decoding methods are known from the Audio Engineering Society Preprints of Oct. 31st, 1980, Nr. 1677, and Mar. 2nd, 1982, Nr. 1885. The individual data words which represent, for example, samples of an audio signal, are interleaved; parity check sums are added, and the data words are formatted into blocks. In the case of the well-known DASH format, this means that 4 parity check sums, 2 of them Q and 2 of them P, as well as a word for error detection, are added to 12 data words.

In decoding according to state-of-the-art methods, a number of processing steps are common.
1. processing of the block error detection
2. processing of the 1st correction code
3. processing of the 2nd correction code In this sequence, each previous code is used as an error indicator for the following one.

The repeated evaluation of the 1st and the 2nd correction code makes it possible to improve the correction capability of the method and its implementation. However, the effect of multiple correction steps remains limited. Without an error detection performed by the code for block error detection, it is only possible to correct 2 consecutive blocks with 2 processing steps.

SUMMARY OF THE INVENTION

The invention, as characterized in the claims, solves the problem of defining a method and an implementation which make it possible to correct a larger number of consecutive erroneous blocks without increasing the number of processing steps.

The advantages provided by the invention are to be seen in particular in that for example, the rerecording of a new signal over a previously recorded signal with intermittently perturbed overwriting creates short zones on the recording medium with signals unrelated to the new recording which can, according to this invention, be effectively corrected in the same way as conventional read-out errors. This makes it possible to operate a digital tape recorder without the need for an erase head. In the case of read-out errors occurring in bursts, the correction capability of the decoder can, thanks to the invention, be considerably increased with a moderate number of correction steps. In tape recordings which have been cut and joined, unrelated data words are present in the vicinity of the cut on several tracks and this data distribution could be erroneously interpreted as a write error. This invention makes it possible to discriminate reliably between errors caused by tape cuts and individual write errors on individual tracks, thus making possible an acoustically adequate processing of the signal at the position of the tape cut.

BRIEF DESCRIPTION OF THE DRAWINGS

In the following, the invention will be explained on the basis of pictures representing only one possible implementation.

FIGS. 6, 7a and 7b show in enlarged schematic representation parts of a memory for data words and correction words FIG. 8 shows an overview in the form of a table of the possibilities for error correction

DETAILED DESCRIPTION OF THE PREFERRED EMBODIMENTS

Figure 1:
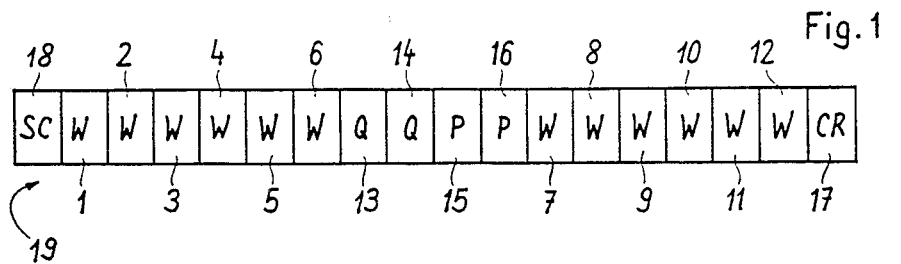
FIG. 1 shows schematically a block with data words and correction words

FIG. 1 shows a block 19 consisting, from left to right, according to well-known rules, of a synchronization word 18, a first group of data words 1, 2, 3, 4, 5, and 6, a pair of Q-correction words 13 and 14, a pair of P-correction words 15 and 16, a second group of data words 7, 8, 9, 10, 11 and 12, and of a block error detection code (CR for CRCC=Cyclic redundancy check code) 17. For example, all those words can have a word length of 16 bits, as is used in the familiar DASH-format.

Figure 2:
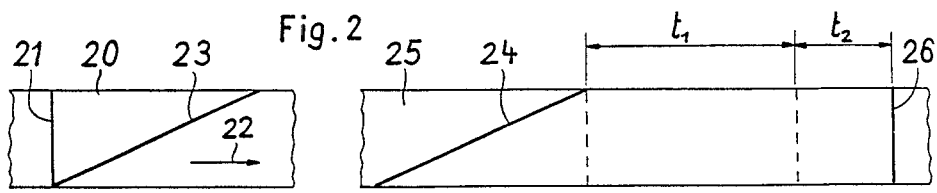
FIGS. 2 through 5 show schematically parts of a memory for data words and correction words

FIG. 2 shows part 20 and 25 of a memory which has a structure in columns and rows as is shown also in FIG. 6. The individual memory locations can be accessed via addresses and in such a way that position and time are equivalent concepts with reference to the contents of the memory locations. In coding and decoding, a division in even and odd odd data words is common practice, and it will be assumed to be used in this example.

The left side of FIG. 2 with part 20 therefore shows a coder in which consecutive odd data words are written into memory locations along a line 21. During the process of writing, 2 correction words will be added to the data words. The temporal resp. spatial orientation is indicated by an arrow 22.

With an arbitrary starting time, non-consecutive odd data words and correction words 1 to 15 will be for example read out of the memory locations along a read-out line 23.

Figure 11:
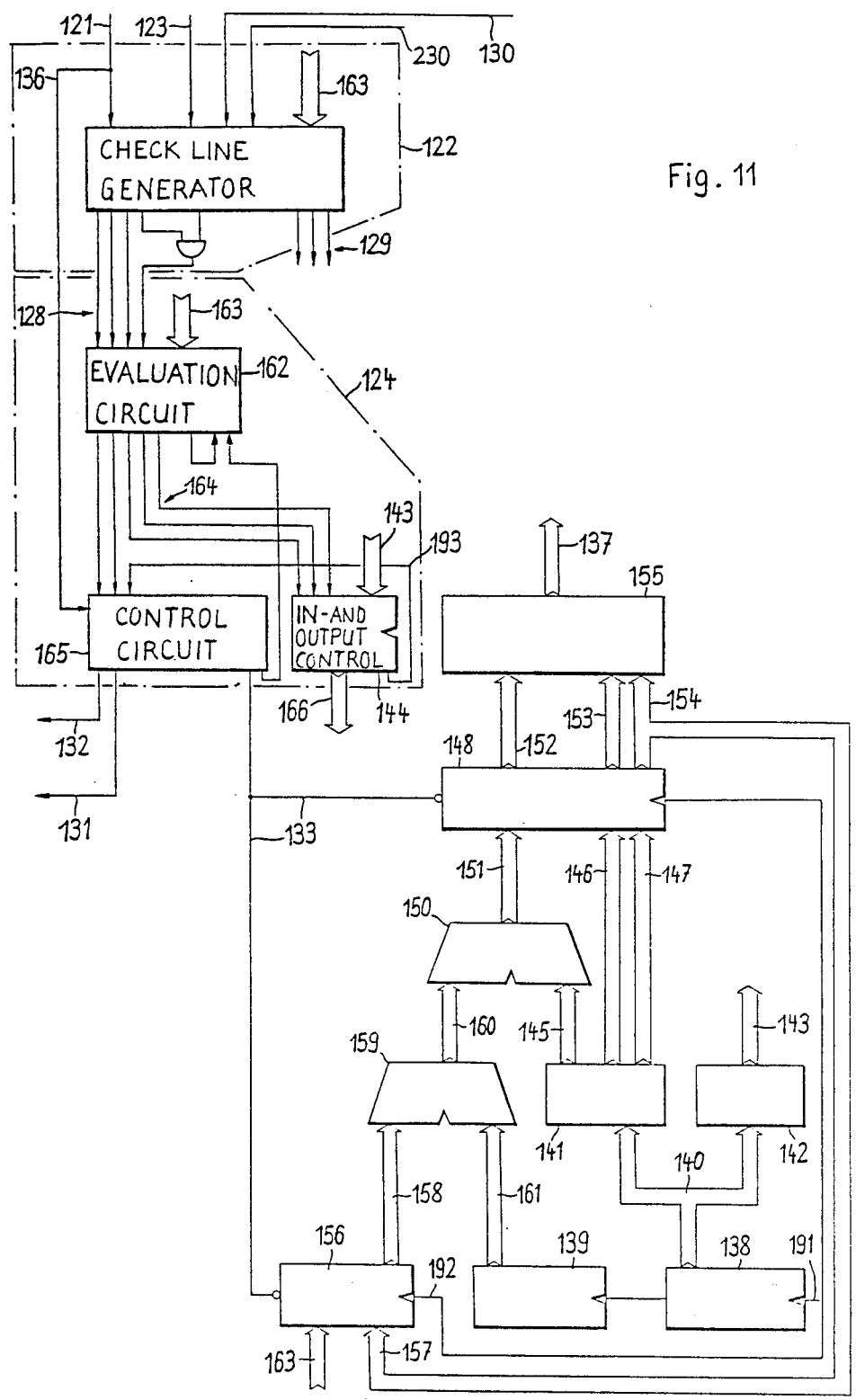

This means that each of the data words and correction words 1, 3, 5, 7, 9, 11, 13, 15 has undergone some temporal delay with respect to its neighbours. The processes of writing and reading out occur in well-known fashion through control via an address generator 141 (FIG. 11).

The right side of FIG. 2 shows part 25 of the memory for recombining or decoding the data words and correction words originating from a write line 24. The read-out occurs again parallel to the columns and at points in time which are characterized by the position of a read-out line 26. The odd data words and correction words undergo in part 25 of the memory an additional temporal delay given by times t1 and t2.

Figure 3:
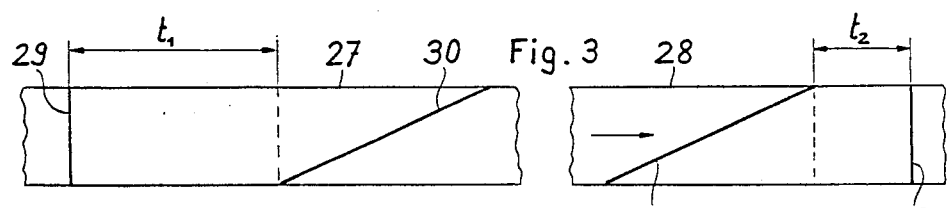

FIG. 3 shows further parts 27 and 28 of the memory which correspond to the parts 20 and 25 of FIG. 2. In parts 27 and 28, even data words are coded and decoded. The simultaneous writing along a write line 29 is followed by a temporal delay by time t1 until the beginning of the temporally staggered read-out along an inclined read-out line 30.

Decoding occurs again between the writing in of data words and correction words along a write line 31 and the read out of data words along a read-out line 32 after an additional delay by time t2.

Figure 4:
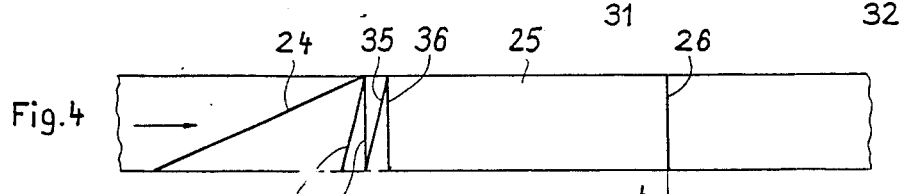

FIG. 4 shows again part 25 of the memory of FIG. 2. In FIG. 4, additional check lines 33, 34, 35 and 36 have been entered along which the groups of words are arranged which are submitted to checking and evaluation operations. These operations can be performed during time t2.

FIG. 5 shows again part 20 of the memory of FIG. 2. The lines 21 and 21a for the computation of the P- and Q-correction words are indicated.

Figure 5:
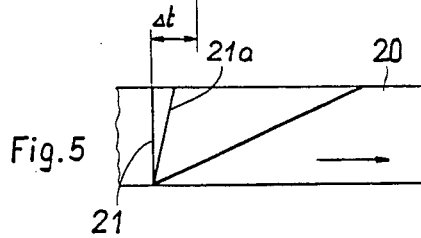

FIGS. 4 and 5 show the relative position of the write line 21 of the coder for odd data words and the read-out line 26 of the decoder for odd data words. This means that in the address generator 141 (FIG. 10 and 11) the write addresses for the coder and the read-out addresses for the decoder have an offset corresponding to time Δt.

FIG. 6 shows a portion of part 25 of the memory corresponding to FIG. 4. It illustrates more clearly the structure of the memory consisting of rows 37 and columns 38. Part 25 of the memory displays 8 lines 37 for the decoding of the 8 odd data words and correction words of block 19. The number of the columns 38 is a function of the time requirement for the writing and for the delays t1 and t2. Data words and correction words are written along the write lines 39 and 40. As illustrated in block 19, data words 1, 3 and 5 as well as the Q-correction word 13 can be seen along the write lines 39, 40. The remaining odd data words and correction words are to be found also along the write lines 39, 40, but outside the range of FIG. 6. First lines 41 and 42 define a first word group Q0 with 6 data words, 1 P-correction word and 1 Q-correction word coming from different consecutive blocks.

Along section lines 43 and 44, which coincides with a column 38, a second word group P0 with 6 data words is arranged. Third lines 45 and 46 parallel to the first lines 41 and 42 define a third word group Q1, and fourth lines 47 and 48 parallel to the second lines 43 and 44 define the fourth group P1.

The data words and correction words of block 19 (FIG. 1) along the write lines 39, 40 display an interleave distance 49. The time corresponding to this interleave distance 49 is greater than the time corresponding to one length 50 of the first and third word groups Q0 and Q1.

The first and second word groups Q0 and P0 and the block 19 along the write lines 39, 40 intersect in data word 1 of block 19. The third word group Q1 intersects the second word group P0 in its last data word, and intersects the fourth word group P1 in its first data word. It is to be understood that the words of block 19 belong to a first sequence of coded and therefore not consecutive data words of a digitized signal in a first ordering and that the data words of groups P0 and P1 belong to a second sequence of consecutive data words and correction words in a second ordering.

Figure 7B:
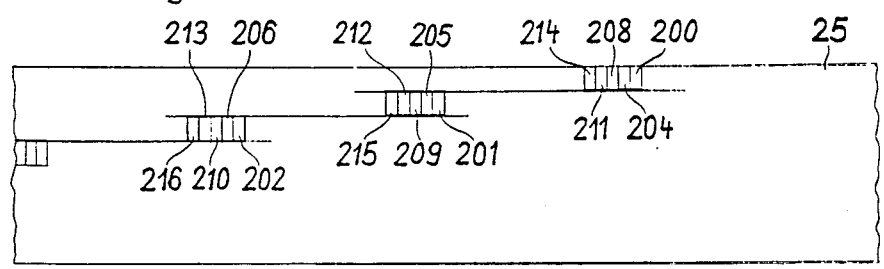

FIG. 7a shows part 25 of the memory in a way similar to FIG. 6. The write line 40 can again be recognized. The figure also shows 3 groups 51, 52 and 53 of data words as well as part of the group 54 of correction words. These groups 51, 52, 53, 54 contain, in this example, 30 data words or correction words each. The first data word and correction word 59, 63, 69, etc. from each group 51, 52, 53 and 54 etc. form together a block 19 of data words and correction words. The second data word and correction word from each group 51, 52, 53 and 54 form together, again, a block 19 of data words and correction words, etc. Additionally, several Q1- and P1-check groups corresponding to different points in time are shown. FIG. 7b shows the same part 25 of the memory in which data words 200 to 216 have been outlined more clearly.

FIG. 8 shows an overview in the form of a table of the relationships between occurring error patterns, correction possibilities corresponding to the occurring error patterns, and the coding of the corresponding error patterns with logical variables as they are used in processing.

If one limits the examination in a first step to both lines 55 and 255, line 55 indicates the error state in a Q- or P-word group, and line 255 carries the value which can be derived from this error state. The checking operation consists in determining the number of erroneous data words in a word group, using well-known methods, with an AWF signal as a result, and also consists in checking whether the parity sum of all error-free data words from a word group has the value zero, yielding a signal SRW.

Lines 56 and 57 in FIG. 8 represent the coding of the error patterns characterized by AWF and SRW for further processing of the error signals. ZKA means that the word group contains too many erroneous words, and EZP means that a word group contains unrelated data word, i.e. words with a sum differing from zero.

The above-mentioned variables have the following meaning:

AWF=0 means that the evaluation of the block error detecting code 17 for a block 19 has indicated no error for any of the data words and correction words of the word group and therefore of the involved blocks 19

AWF=1 means that the evaluation has indicated a total of one error for the data words and correction words of the word group and therefore for the involved block 19

AWF>1 means that the evaluation has indicated a total of more than one error for the data words and correction words of the word group and therefore for the involved block 19

SRW=0 means that the modulo-2 sum of all error-free data words and correction words of the word group yields a value equal to zero SRW=1 means that the modulo-2 sum of all error-free data words and correction words of the word group yields a value not equal to zero ZKA=1 means that the word group contains a maximum of one error detected by the block error detection code, and that the modulo-2 sum of all error-free data words and correction words therefore represents precisely the correct value of the falsified data word or correction word, so that the error can be corrected ZKA=1 means that the word group contains more than one error, in which case an error correction is no longer possible within the group EZP=1 means that the modulo-2 sum of all error-free data words and correction words of the word group yields the value zero, and that no errors have been identified by the block error detection code EZP=1 means that the modulo-2 sum of all error-free data words and correction words of the word group does not yield the value zero, and that no errors have been identified by the block error detection code.

In FIG. 8, all entries to the right of the diagonal 58 or other diagonals parallel to it refer only to Q0- and Q1-groups, and all entries to the left of the diagonal 58 only to P0- and P1-groups. In the remaining positions of the table, EWK means that the corresponding error pattern can be corrected; MPZ means that all data words and correction words of the Q- or P-group must receive a corresponding flag, and MKW means that the first data word 1 of a block 19 must receive a corresponding flag.

Figure 9:
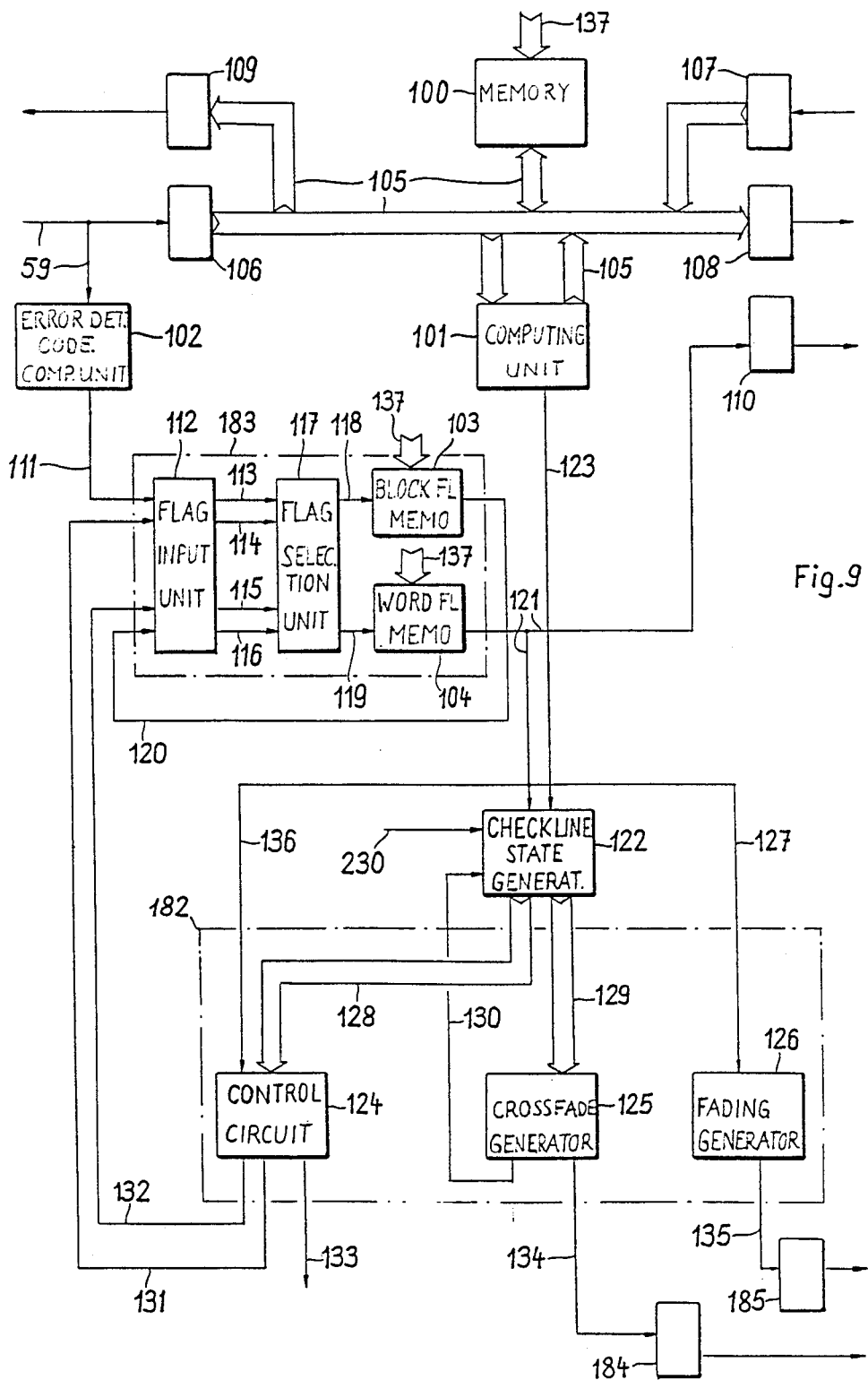
FIG. 9 is a schematic overview of an apparatus for combining and re-combining incoming data words belonging together

FIG. 9 shows an apparatus for combining and recombining data words. This consists in the main part of a memory 100 for data and correcting words, a computing unit 101 for performing the checking and evaluation operations on Q- and P-word groups, of an error detection code computing unit 102, of a memory 103 for the block error flags and of a memory 104 for the word error flags. These are part of an assignment circuit 183 for block and word error flags. A data bus 105 connects memory 100 and computing unit 101 with data input units 106 and 107 and data output units 108 and 109. A further output unit 110 handles word flags. The computing unit 102 is connected to a flag input 112 via a line 111 and this flag input unit 112 is connected via lines 113, 114, 115 and 116 with a flag selection unit 117. This flag selection unit 117 is connected via lines 118 and 119 with the block flag memory 103 and the word flag memory 104. Additionally the block flag memory 103 is connected with the flag input unit 112 via line 120. A line 121 connects the word flag memory 104 with the output unit 110 and also with a check line state generator 122. This state generator 122 is also connected with the computing unit 101 via line 123. The check line state generator 122 is followed by a control circuit 124 for correcting short individual write and read errors, by a write error detector and crossfade generator 125, all these three units being in parallel.

Parallel to the check line state generator 122 with the control circuit 124 and the write error detector and cross-fade generator 125 a read error detector and fading generator 126 is also present, connected via line 127 and line 121 with the word flag memory 104. The check line state generator 122 is connected via bus 128 with the control circuit 124 and via the bus 129 with the crossfade generator 125. Additionally it is connected by line 130 with the check line state generator 122. The control circuit 124 has further two connections 131 and 132 to the flag input unit 112, and to a further output 133. Additionally there is a connection 136 between the control circuit 124 and line 121 respective the word flag memory 104. Outputs 134 and 135 of the crossfade generator 125 and the fading generator 126 are each connected to an output 184 and 185. The control circuit 124 for correcting short individual write and read errors, together with the write error detector and crossfade generator 125 and the read error detector and fading generator 126 form together a decision unit 182.

The memory 100 the block flag memory 103 and the word flag memory 104 are all connected to a same address bus 137.

Figure 10A:
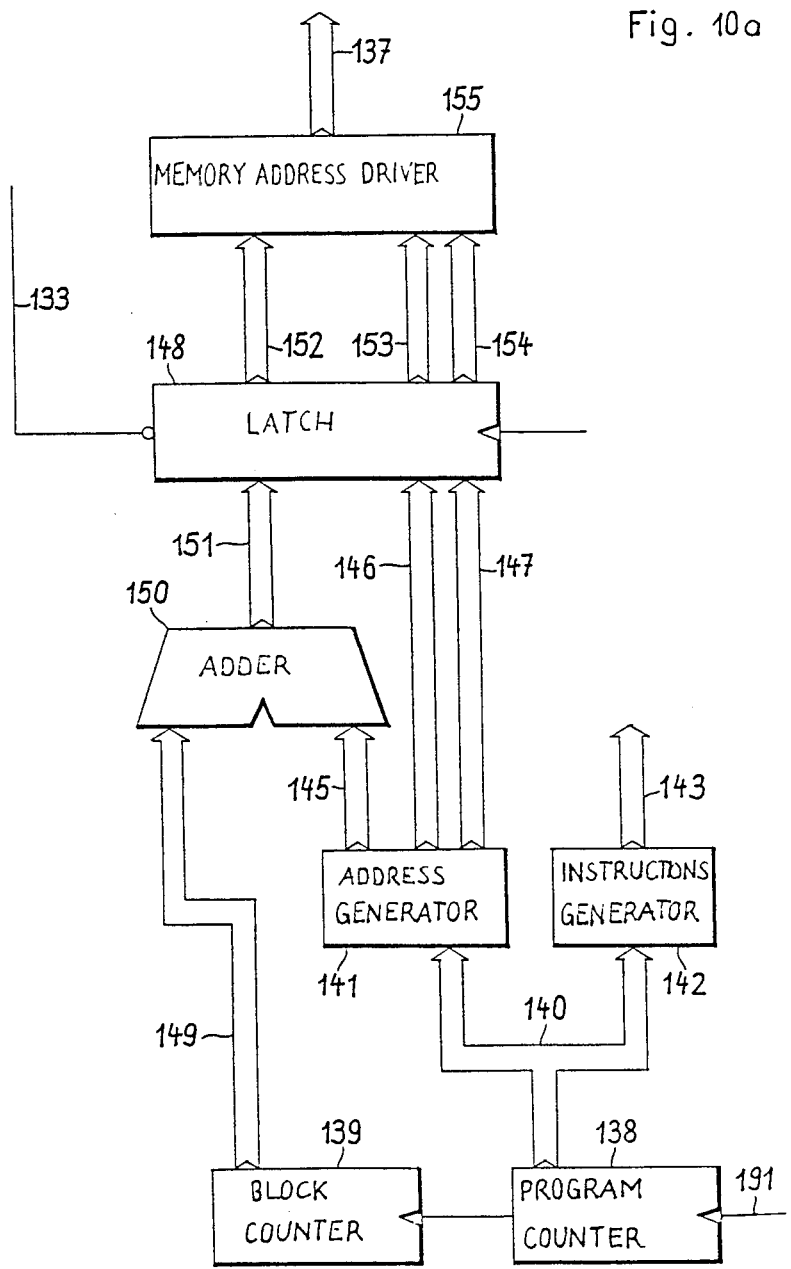
FIGS. 10a, 10b, 11, 12 and 13 show parts of the apparatus according to FIG. 9.

The circuit whose main task is to feed this address bus 137 with addresses can be seen in FIGS. 10a and b. The circuit according to FIG. 10a contains a program counter 138 which counts the running program steps and a block counter 139 receiving its clock from the program counter. The program counter 138 is connected via a bus 140 with an address generator 141 and with an instructions generator 142. The address generator 141 yields addresses for each program step, whereas the instructions generator 142 yields instructions as a function of each program step. Additionally an input and output control unit 144 (FIG. 11) is connected to the instructions generator 142 via bus 143. It controls such elements of the apparatus as memories, computing units etc.

For the delivery of addresses the address generator 141 feeds three busses 145 146 and 147 for block addresses track addresses and word addresses. Bus 146 and 147 both feed the same latch 148. Bus 145 as well as bus 149 from the block counter 139 feed an adder 150 from which a bus 151 with block addresses feeds the latch 148. Latch 148 is connected by three busses 152, 153 and 154 for block addresses track addresses and word addresses to a memory address driver 155 which groups the block- track- and word addresses and feeds them to bus 137.

Figure 10B:
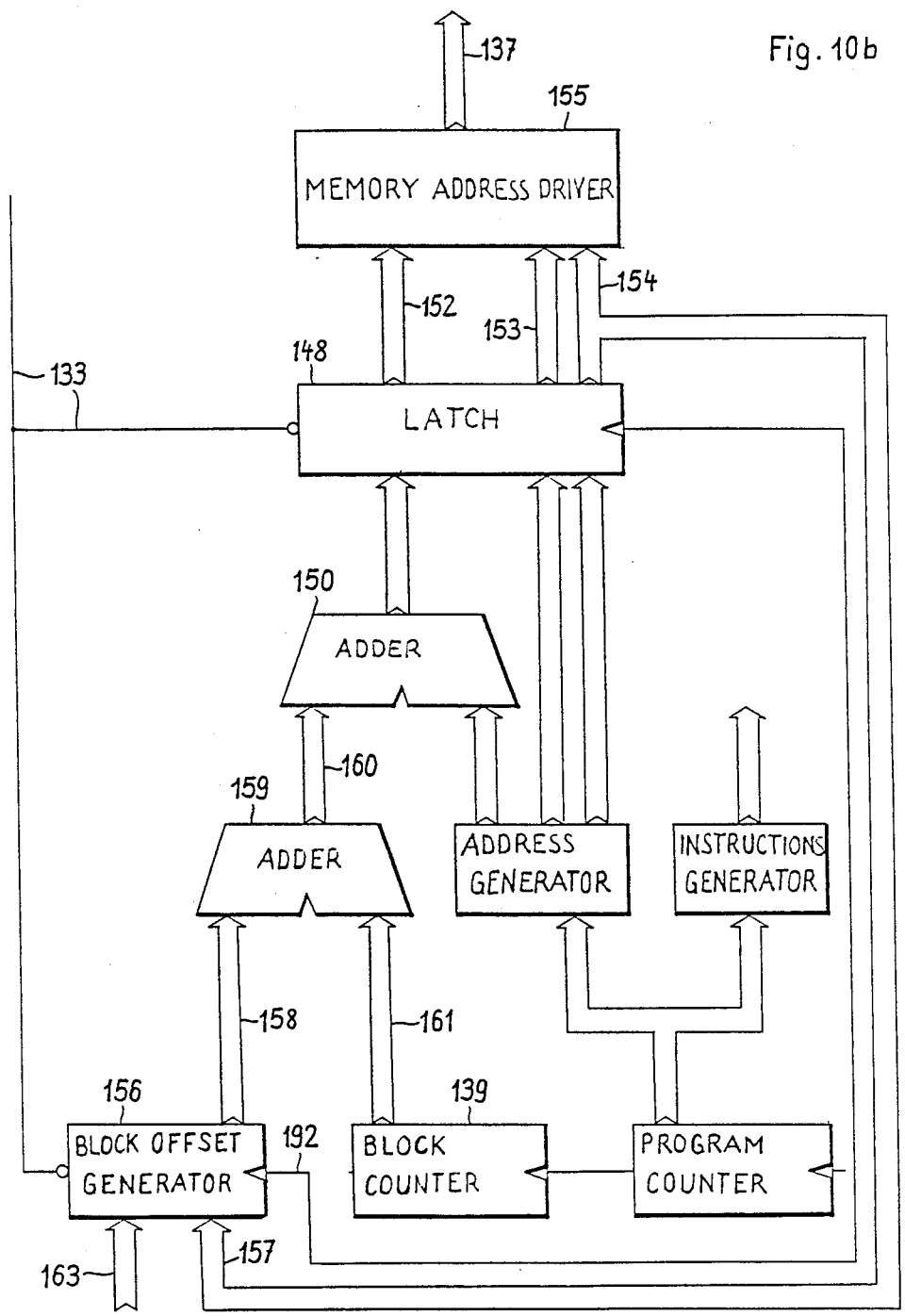

A special form of implementation of the circuit according to FIG. 10a is represented in FIG. 10b. It features in parallel to block counter 139 a block offset generator 156 synchronised via line 192 with the latch 148 and which is connected on the one hand via a bus 157 to the bus 154 for word addresses and on the other hand with a further adder 159 via a bus 158. This adder 159 is connected via bus 160 with the adder 150 and via a bus 161 with the block counter 139. Via line 133 the latch 148 and the block offset generator 156 receive enable control signals. A bus 163 feeds the block offset generator 156 with its timing signals.

FIG. 11 again represents the whole circuit according to FIG. 10b, but includes the connections with the check line generator 122 and the already mentioned lines 121, 123, 130 as well as connections 131, 132 and 136. This connection is done via lines which forms the bus 128, via the evaluation circuit 162, via the bus 164, via the control circuit 165 and via the line 133. The bus 143 feeds instructions from the instructions generator 142 to an input and output unit 144. Control signals are distributed via a bus 166. The timing is also distributed via a bus 163 to the check line generator 122 and the evaluation generator 162.

Figure 12:
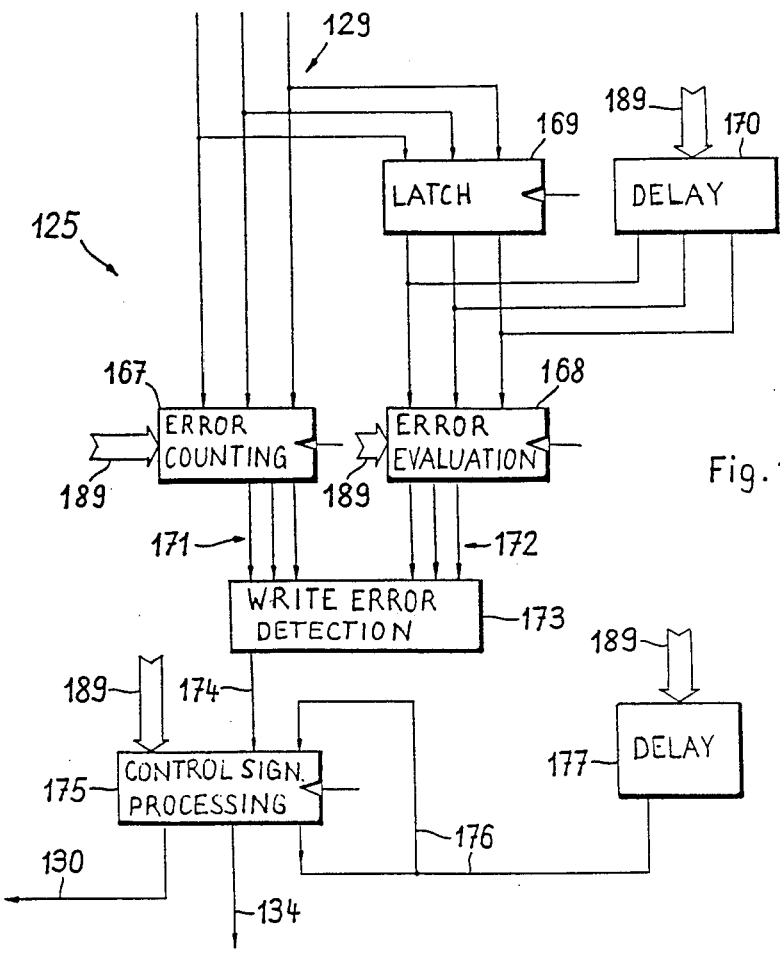

FIG. 12 shows the write error detector and the cross-fade generator 125. This consists of two separated error counting and error evaluating circuits 167 and 168 for the Q1- and P1 words groups as well as for the Q0- and P0-word groups. Those are connected via bus 129 to the check line state generator 122. The error counting and error evaluating circuit 168 is preceeded by a latch 169 an a delay circuit 170. The error counting and error evaluating circuits 167, 168 are followed by a write error detector 173 connected via bus 171 and 172, and the combination of units 167, 168 and 173 detect write errors on several tracks corresponding to a large number of blocks. Detector 173 is connected via line 174 with a control processing circuit 175 which is connected in parallel with a control signal delay circuit 177 via line 176. This circuit has an output 134 for crossfade signals. In this figure 189 indicates connections for the distribution of several timing signals which however do not distribute identical timing signals to each element.

Figure 13:
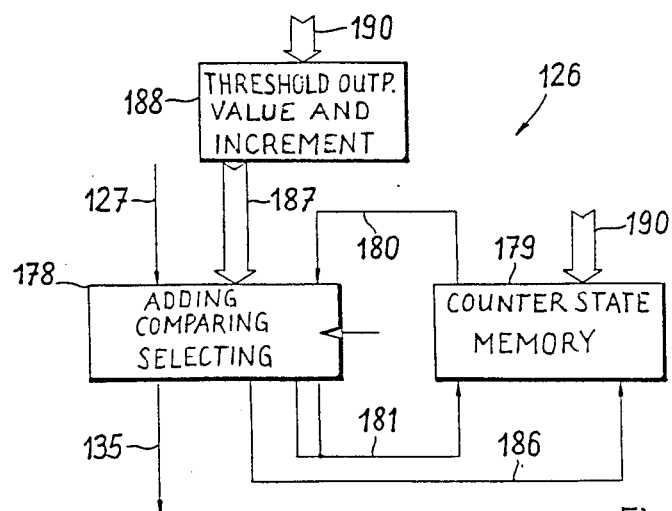

FIG. 13 shows the read error detector and muting generator 126 which consists of an adding comparing and selecting circuit 178 which is connected on the one hand via lines 180 181 and 186 with a counter state memory 179 and on the other hand is connected to a generator for threshold output value and increment 188 via a bus 187. The selector circuit 178 has an additional output 135 for a muting signal as well as an input for word flags via line 127. The adding circuit which is part of the adding comparing and selecting circuit 178 forms together with the counter state memory 179 a counter. Here again 190 refers to a bus for distributing timing signals.

The following list indicates which commercially available components can be used for implementing the elements of the circuit. For simplicity the list will only contain the numbers used for referencing the elements and the types of the commercially available circuits.

| 100 | 16k × 4 dyn RAM | 138 | 74 LS 169 | 167 | PAL 16 R6 |
| 101 | 2 × PAL 20 × 8 | 139 | 74 LS 169 | 168 | PAL 16 R6 |
| 102 | 9401 | 141 | bipolar- | 169 | PAL 16 R4 |
| 103 | 64k × 1 dyn RAM | 142 | PROM s | 170 | 1024 × 4 CMOS RAM |
| 104 | 64k × 1 dyn RAM | 144 | PAL 16 R8 | | |
| 106 | 74 LS 322 | 148 | 74 LS 377 | 173 | PAL 16 R4 |
| 107 | 74 LS 374 | 150 | 74 LS 283 | 177 | 1024 × 4 CMOS RAM |
| 108 | 74 LS 377 | 155 | 74 LS 157/244 | | |
| 109 | 74 LS 166 | 156 | PAL 16 R4 | 178 | PAL 16 R4 |
| 112 | 74 LS 174 | 159 | 74 LS 283 | 179 | 256 × 1 bip RAM |
| 117 | 74 LS 157 | 162 | PAL 16 R6 | | |
| 122 | PAL 16 R6 | 165 | PAL 16 R4 | 188 | PAL 16 R8 |

When coding related consecutive data words a number of well known processing steps will be used. The even and odd data words will be handled separately and will be e.g. written into separate parts of a memory 100. Data words will be grouped in a well known way into blocks. Thus e.g. the odd data words will be written along write lines 21 ( FIGS. 2, 5). This takes place on data input 107 and bus 105.

During the decoding or recombining process the recorded blocks consisting of essentially unrelated data words and correction words are fed serially over line 59 into the data input 106 and the computing unit for block error detection 102. They leave the data input 106 serially and are written into memory 100 along write lines 24 and 31 (FIGS. 2, 4) so that the related data words and correction words separated in even and odd data words can be found in columns 38 of memory 100. At the same time the block error detection code of the corresponding blocks is entered and evaluated in the computing unit 102. If e.g. error has occured so that 30 consecutive blocks have become erroneous on the tape there follows on memory 100 an error configuration as illustrated in FIG. 7 which groups 51, 52, 53 of data words and groups 54 etc, of correction words are erroneous. The operation of the decoder will be illustrated on the basis of this example.

The 30 erroneous blocks enter the error detection code computing unit 102 and are detected as erroneous. Line 111 accordingly carries 30 block error flags which are written into the block flag memory 103 via flag input 112, line 113, the flag selecting unit 117 and line 118.

One Q0-word group and one P0-word group are fed via bus 105 from memory 100 into the computing unit 101 under control of corresponding addresses on the address bus 137 and the corresponding word flags fed from the word flag memory 104 via line 121 to the check line state generator 122. This has been preceeded by entering the block flags into the word flag memory 104 from the block flag memory 103 via line 120 the flag input 112 line 116 the flag selecting unit 117 and line 119 under control of addresses carried by the address bus 137. The checking occurs according to state of the art techniques.

The computing unit 101 is a modulo-2-adder. In this computing unit 101 the error free data words and correction words of a group to be checked are added, the resulting sum is compared with the value zero yielding logical variable (SRW signal) and the result is fed to the check line state generator 122 via line 123.

In the check line state generator 122 the number of erroneous word flags in the word group (AWF signal) is evaluated at the same time.

At the end the checking operation one out of four separate cases can occur according to line 55 of FIG. 8. On the basis of this the check line state generator 122 generates and codes error signals corresponding to lines 56 and 57 of FIG. 8.

For our example we shall have:

AWF = 1 and SRW = X for the Q- and for the P-word group. Therefore we have a case as indicated by entries 60 of the table. The data word 59 can be corrected in the P- and in the Q-word group.

After the step of checking for the P0- and Q0-word groups modification steps will be carried out for the same word groups. In this particular case they will consist at least of correction operations.

In a first part of the manipulation operations the error free data words and correction words of a word group will be accumulated in the computing unit 101 and the result will be stored. As only one single erroneous word has been observed, the stored sum consists precisely in the original value of the data word prior to its falsification.

In a second part of the manipulation operation the control circuit 124 generates on the basis of signals coming via bus 128 from the check line state generator 122 and on the basis of signals coming form the word flag memory 104 over line 136 a signal 1 instead of 0 which is fed via line 133 to latch 148 which containes the address of the erroeous data word as well as its word flag.

A result is that the addresses fed by latch 148 over bus 152, 153, 154 to memory address driver 155 and fed via bus 137 to memory 100 and to word flag memory 104 will remain unmodified until on the basis of a control signal coming via bus 166 the corrected data word is entered into memory 100 and the modified word flag indicating that the word has been corrected is entered via line 132, the flag input unit 112, line 115, the flag selecting unit 117 and line 119 in the word flag memory 104. This is followed by the modification operation of the P0-word group.

The checking and modification operations for the Q1 and P1 word groups (FIG. 6) are made in the same way. In this case in FIG. 7a data word 59 will have to be taken instead of data word 1 according to FIG. 6. Because of the manipulation and correction steps performed previously on words groups Q0 and P0 the vicinity of data word 59 is now error free.

The generation of addresses for the individual processing steps shall be briefly explained on the basis of FIG. 10a. Program counter 138 contains a number of modular program steps which are gone through periodically in the same sequence. The program counter 138 counts these under the control of a clock signal which is fed to it via line 191. Its counter state is fed continuously to the address generator 141 and the instructions generator 142. On the basis of the numerical information it receives the instructions generator 142 delivers an instruction on bus 143 and the address generator 141 delivers block- track- and word addresses on to busses 145, 146 and 147. The block counter 139 continuously counts the blocks entering the decoder and carries this number over bus 149 to the adder 150. This also ensures that the word address present in latch 148 is that of the erroneous data word 59. The instructions generator 142 also feeds the corresponding instruction via bus 143 to the input and output control 144 and via line 193 to the control circuit 165 which can deliver the correct output signal over line 133 as dealt with already.

All data words starting with data word 59 and extending to data word 61 in FIG. 7 can be corrected according to the same procedure.

In the interval extending between data words 61 and 62 each Q- and P-word group contains at least two erroneous data words and/or correction words, as can be seen from FIG. 7a. During the check operations of the corresponding word groups, those erroneous data words and/or correction words are marked as already described with information stored in the word flag memory 104. In a Q-P-word group a word correction can only take place if one single data word or correction word is erroneous in the word group. In the interval between data words 61 and 62 e.g. the Q1-word group occurring first can only correct data words 63. The P1-word group will be shifted as will be described in detail later on relatively to the Q1-word group by one times two blocks, so that it then contains data word 63. In this way data word 64 can be corrected. The Q1- and P2-word groups are therefore capable of correcting all erroneous data words or correction words of the groups 51 and 52 between the data words 61 and 62. On the other hand data words 65, 66, 67 and 68 of group 52 can be corrected via the P0-word group only. Data word 61 again can be corrected by the word group Q1. However in order to correct data word 70 the P1-word group must be shifted with respect to the word group Q1 by two times two blocks to the left respectively by an equivalent temporal delay so that the Q1-word group and the P1-word group intersect in data word 69.In this way again all data words and correction words of groups 52 and 53 can be corrected until the end of group 52.

In a code with four correction words for twelve data words and with an interleave distance of seventeen blocks and an inclination from Q to P of two blocks as is e.g. the case for the crossinterleave code of the DASH-format thirty consecutive erroneous blocks can be corrected in this way.

In order to implement this correction method with a P1-word group the position of which can be varied with respect to that of the Q1-word group the generation of addresses for the P1-word group takes place according to the arrangement shown in FIG. 10b or FIG. 11. This operates in the same way as has been described in FIG. 10a with the difference that the word flag in a correctable Q1-word group is used in order to generate a new block address for the P1-word group. This takes place when the address generator 141 delivers the addresses of those data words and correction words which have been submitted to a check operation. Those addresses are fed also to the word flag memory 104 which generates in the case of an erroneous data word a signal going via lines 121 and 136 to the control unit 165 which itself generates a signal via line 133 to the latch 148 and to the block offset generator 156.

In that case line 133 carries the address of an erroneous but correctable data word or correction word. This will be used on the one hand in order to prevent a new address being written into the latch 148 for one clock period with the result that in the next clock period the corrected data word can be written at the same address in memory 100 and on the other hand to indicate to the block offset generator 156 when it can read the word address in a correction step for a Q1-word group. On the basis of the address, fed to the block offset generator 156 via bus 157, of this data word or correction word which has been marked as erroneous the block offset generator 156 computes the block offset. This number is fed via bus 158 to the adder 159 where it is added to the running block number. The result is fed via bus 160 to the adder 150 which generates a modified block address which is fed via bus 151 to the latch 148.

If more than 30 block have been detected as erroneous by the block error detection code the corresponding flags of the data words and correction words will be written into the word flag memory 104 and will go via line 121 to the output control unit 110 and to an interpolation circuit built according to well known state of the art methods and not described here in further detail in which the data words which can not be corrected will be replaced by interpolated values computed from neighboring correct data words.

In the case of read out errors the output signal will be muted starting after 289 consecutive blocks marked as erroneous. Muting of the output signal is also necessary after four consecutive data words marked as erroneous.

In the case of the recording of music signals at relatively low tape speeds the audio data words are distributed according to precise specifications onto four tracks of the recording medium.

When reconstructing the audio signal from four separate tracks patterns of erroneous data words occur which must be processed accordingly, one example being the interpolation of up to three consecutive data words.

Because of the necessity of muting the cycles for writing and reading data in memory 100 and in the word flag memory 104 are chosen in such a way that the moment in time at which uncoded data words are written into memory 100 (line 21 in FIG. 5) corresponds to the moment in time when the word flags of the decoded data words are read out of the wordflag memory 104. This occurs at time interval t before the corresponding decoded data words are read out of the memory 100 (line 26, fir. 4). The read out of the word flags from the word flag memory 104 is based on the same addresses as have been used for writing in the not yet encoded data words into memory 100 as fed on address bus 137. The time interval $\Delta t$ corresponds to the time necessary for carrying out a muting operation. The word flags of consecutive erroneous data words are fed via lines 121 and 127 to the read error detector and muting generator 126. If the number of counted word flags exceeds the threshold value the comparing circuit 178 will deliver at its output 135 a muting signal. At this time a second counting process begins which runs in the same way as the first one but with the difference that instead of reading word flags from line 127 the counter state will be increased step by step via the increment generator 188 until a second stored threshold value has been reached. In this way the muting signal can be removed. The first counting process is restarted every time the sequence of consecutive erroneous word flags is interrupted by at least one word flag indicating no error, unless, as mentioned above, the first threshold value has already been reached. As the word flags preceed the data by a time $\Delta t$ the muting of the data words can take place in time.

The adding comparing and evaluating circuit 178 operates serially within one sampling interval. In a first step, an addition and a comparison take place simultaneously for two counters in time multiplex.

In a second step again in time multiplex for two counters and in function of the selection operation of the first step write commands for the counter state memory 179 are generated and fed to line 186. Simultaneously the muting signal is generated and fed via line 135 to subsequent unit for processing data words, which needs not be explained in more details here.

Overwrite errors can occur when a previous recording on e.g. a magnetic tape is overwritten by new data without prior erasing and when additionally the recording mechanism is disturbed e.g. by dust particles. When explaining the operation of the apparatus it will be assumed that according to FIG. 7b two consecutive data blocks with data words 200, 201, 202 and 204, 205, 206, are followed by two data blocks with data words 208, 209, 210 and 211, 212, 213 belonging to the previous recording. It will be further assumed that they are followed by a block with data words 214, 215, 216. It will be additionally assumed that the data blocks for new data and old data have a sufficiently high level of magnetisation, while the data blocks in the transition from new to old data and from old to new data do not have a sufficiently high magnetic level, so that they are detected as erroneous blocks. Finally it will be assumed that the blocks with data words 200, 201, 202 is also preceeded by new data.

For the first two blocks with the data words 200 to 206 which do not have a sufficiently high level of magnetisation the following assumption will be made:

The block first enters the block error detection code computing unit 102 via line 59. The result of its evaluation is a block error flag which is fed via line 111 to an assignment circuit 183. The data words 200 to 206 mentioned above are written into memory 100 as described before and are submitted to a check operation for Q0- and P0-word groups in the computing unit 101. The error signals (SRW) delivered by the computing unit 101 via line 123, together with the word flags for the mentioned data words and correction words from the assignment circuit 183 as carried on line 121 yield an error pattern according to the entry 60 in the table of FIG. 8. The data words and correction words 200 to 206 will be processed in the same way as the data word 59 in the FIG. 7a.

For the further two blocks with data words 208 to 213 which have a sufficiently high magnetisation level the following will be true:

The block error detection code computing unit 102 indicates that those blocks are error free and yields a corresponding signal via line 111 to the assignment circuit 183.

The data words 208 to 216 are marked as error free and are checked in the computing unit 101 in which the data word 208 respective 211 are the first to be checked. This word will be recognised as erroneous because it belongs simultaneously to a Q0- and a P0- word group each of which carry one erroneous data word. This corresponds to the error pattern of entry 71 in FIG. 8.

The instruction generator 142 containes a program routine which causes that on the one hand the word flag of the actually erroneous data word 208 or 211 will be set as erroneous and on the other hand the block flag of the block to which the erroneous data word 208 belongs will be marked as erroneous in the blockflag memory 103.

As soon as this process is completed the check line state generator 122 will be reset with a clock signal via line 230 from its state Q-EZP=1, Q-ZKA=0, P-EZP=1, P-ZKA=0 into the new state Q-EZP=0, Q-ZKA=0, P-EZP=0, P-ZKA=0, which means that the check groups Q0 and P0 are correctable. The data words 208 and 211 have now been marked as erroneous then ondergo the same manipulations as e.g. the data words 59 and 259 in FIG. 7a.

The block flags in the block flag memory 103 do not occur simultaneously with the data word in memory 100 but are present already at the time of checking of the preceeding Q-word group so that the data word 209 and 210 and the following datawords of this block already appear with the new word flag. In this way up to fifteen consecutive erroneous blocks can be corrected.

The blocks with data words 214 to 216 which did not have a sufficiently high magnetisation level will be handled in the same way as blocks with the data words 200, 201, 202 and 204, 205, 206. This means that for further processing the data words 200 to 216 will be marked as if they belonged to five consecutive erroneous blocks.

It is important to process the signals resulting from the splicing of two pieces of magnetic tape in such a way that the uncontrolled distribution of data words and correction words at the position of splicing and its vicinity does not leed to an uncontrolled reproduction of data words. For this purpose a controlled process of crossfading will be started. It will take into account that the recorded signal on the magnetic tape has been distributed on several tracks. The apparatus can if necessary handle all tracks in time multiplex.

In order to detect the position of the splicing the apparatus must differenciate the appearance of caracteristic errors for a splicing position from individual errors which occasionally occur on individual tracks which are normally limited to a length between 1 and 3 blocks typically. Thus in order to decide whether a splicing position is present or not the totalitiy of the errors on all tracks will be examined. This evaluation takes place continuously in the write error detector and in the crossfade generator 125 (FIG. 12).

The check line state generator 122 continuously feeds the signals ZKA, EZP and CRC in a multiplexed form over bus 129 to the crossfade generator 125. This generator stores the signals derived from the checking of Q0- and P0-word groups first in memory 169 and then in the delay circuit 170 during a processing time of 14 blocks, that is until corresponding signals for the related Q1- amd P1-check groups are present. After this the signals will be delivered at the same time to the error counting circuit 167 on the one hand and to the error evaluation circuit 168 on the other hand. This delay time corresponding to 14 blocks makes it possible to differentiate between errors produced by a splice and other individual errors. When the results of error evaluation of all individual tracks are present from circuit 167 and 168 a common signal derived in detector 173 and as a result of a majority decision will be produced and fed to line 174. This result can be used for the processing of the next, that is the 15th block from the appearance of the first error signal. In this next block and for further blocks with a number corresponding to the crossfade time relating to the ODD/EVEN separation the control signal processing circuit 175 feeds a signal via line 130 to the check line state generator 122. This state generator 122 produces via the control circuit 124 valid word flags for the P1-word group in word flag memory 104 which makes corresponding data word and correction word appear erroneous. Simultaneously the control signal processing circuit 175 produces over line 176 a signal going to the control signal delay circuit 177 and this signal will be inhibited until the marking of the data words and correction words in the P1-word group has been completed. Atter this time the signal will be removed from the control signal delay circuit 177. As soon as all marked data words of the first data half of the memory 100 have been read line 134 will carry the start signal for the crossfade.

What is claimed is:

1. A method for transforming a first sequence of words, comprising digital data words and correction words and having a first ordering of said data words and correction words, comprising the steps of:
    forming blocks out of said first sequence, each block consisting of a plurality of said data words and a plurality of said correction words in said first ordering;
    selecting data words and correction words from said first sequence and combining said data words and correction words in a way to form a second sequence with a second ordering of data words and correction words;
    selecting out of the second sequence of words a first group and a second group each composed of data words and correction words in such a way that said first group and said second group (share) have one common word (with one of said blocks of words having the first ordering) and said common word also belongs to one of said blocks composed of words having said first ordering;
    submitting simultaneously the data words of the first group and of the second group to a checking operation;
    evaluating the result of the checking operation and deciding if erroneous data words of the first group and of the second group can be corrected; and
    correcting said second sequence of words using said correction words, when indicated by said evaluation.

2. Method according to claim 1, comprising the steps of:
    selecting out of said sequence of data words and correction words a third and a fourth group additionally to said first and second groups, said third and fourth group each being composed of data words and correction words, such that a common data word belonging to said third group and said fourth group and a common data word belonging to said third group and said second group are obtained, whereby one common data word is the first data word of the fourth group and one common data word is the last data word of the second group;
    submitting simultaneously but subseqently to the submission of said first and second groups the data words of
    said third group and fourth group to a checking operation; and
    subsequently submitting the data words of said third group and said fourth group to known evaluation and correcting operations (operation).

3. Method according to claim 2, comprising the steps of:
    adjoining a word flag to each data word and correction word having been submitted to said checking operations, said word flag indicating that said words are erroneous or error-free;
    using the word flag of an erroneous data word or correction word of said third group to determine the words another fourth group will be composed of, said third and fourth group having said erroneous data word or correction word in common; and
    submitting said fourth group to a known evaluation and correcting operation.

4. Method according to claim 1, comprising the steps of:
    adding a block error detection code word to the blocks of said first sequence prior to transforming said first sequence;
    for transforming said first sequence, first checking said blocks of said first sequence with respect to said block error detection code by generating again a code word and comparing it with the existing code word;
    adjoining a block flag to each block of the first sequence composed of data words and correction words according to the results of said checking with respect to the block error detection code, said block flag marking erroneous and error free blocks; and
    deriving word flags from said block flags for the data words and correction words of said blocks, said word flags being set for a group of word preceeding said group of data words and correction words already under checking and evaluation operations.

5. Method according to claim 4, comprising the steps of:
generating error signals out of results of the evaluating operations and out of results of the checking of said block error detection code; and
generating control signals out of said error signals for controlling operations subsequently carried out on said data words.

6. Method according to claim 5, comprising the step of:
subsequent crossfading of data words.

7. Method according to claim 5, comprising the step of;
subsequent muting of data words.

8. Method according to claim 7, whereas operation of choosing data and correction words and adding code words are carried out in a first memory and whereas corresponding word flags are stored in a second memory, comprising the step of:
using addresses designated for writing in of data words into said first memory for coding, as addresses for reading out of word flags from said
using addresses designated for writing in of data words into said first memory for coding, as addresses for reading out of word flags from said second memory, said word flags belonging to combined data words in said second sequence, for generating a muting signal.

9. Method according to claim 7, comprising the steps of:
counting successive word flags indicating erroneous data words;
comparing the result of said counting with a first threshold value;
generating a muting signal, when said value reach said first threshold value;
start counting pulses of an increment generator when said first threshold value is reached;
comparing the result of the counting of said pulses to a second threshold value; and
stopping said muting signal when the result of the counting of said pulses reaches the second threshold value.

10. Method of claim 5 comprising the step of issuing data words forming said second sequence together with corresponding word flags.

11. Method according to claim 5, whereas digital data words and correction words in said first sequence are recorded on a plurality of tracks on a recording medium, comprising the steps of:
generating error signals related to data words and correction words from each of said tracks;
generating an error pattern out of the error signals from all tracks; and
generating control signals taking into account said error signals from said plurality of tracks.

12. A method according to claim 1, whereas said checking operation comprises adding values of said data words and correction words and comparing the result of the adding operation with a preset value.

13. Apparatus for coding an/or decoding or combining of data words and correction words arriving in a first sequence and arranged in a first ordering into a second sequence with a second ordering, said data words and correction words in said first ordering forming blocks and a block error detection code word is added to each block, comprising:
a memory where said words are written in said first ordering and read-out in said second ordering:
a computing unit connected to said memory for computing sums of data words and correction words and for comparing said computed sums with preset values;
an error detection code computing unit arranged upstream of said memory for computing block error detection code words from arriving data words and comparing the computed code words with inputed existing block error code words; connected downstream of said error detection code computing unit; and
said assignment circuit comprising a block flag memory and a word flag memory connected downstream to said block flag memory and whereas the contents of said word flag memory and said block flag memory can be changed independently.

14. Apparatus according to claim 13, further comprising:
a check line state generator connected to said word flag memory and connected to said computing unit.

15. Apparatus according to claim 14, further comprising:
a control circuit connected to said check line state generator and to said word flag memory; and
a write error detector and crossfade generator connected to said check line state generator.

16. Apparatus according to claim 15, whereas said check line state generator is designed for generating output signals related to erroneous data word and correction word groups to be transmitted to said control circuit and whereas said check line state generator is designed for generating output signals derived from block flags to be transmitted to said write error detector and crossfade generator.

17. Apparatus according to claim 14, whereas said check line state generator is designed for generating output signals reflecting the results of checking operations taking place in said computing unit.

18. Apparatus according to claim 13, further comprising:
a read error detector and fading generator connected to said word flag memory.

19. Apparatus according to claim 18, whereas said read error detector and fading generator comprises:
an adding comparing and selecting circuit;
a generator for threshold output value and increment, connected to said adding comparing and selecting circuit; and
a counter state memory connected to said adding comparing and selecting circuit, whereas said adding comparing and selecting circuit together with said counter state memory constitute a first and a second counter circuit.

20. Apparatus according to claim 19, whereas said adding comparing and selecting circuit comprises inputs connected to said word flag memory, said generator for threshold output value and increment and said counter state memory and whereas said adding comparing and selecting circuit comprises an output connected to said counter state memory as well as an output for transmitting muting signals.

21. Apparatus according to claim 13, further comprising:

a check line state generator connected to said word flag memory and connected to said computing unit, whereas said check line state generator is designed for generating output signals reflecting the results of checking operations taking place in said computing unit.

22. Apparatus according to claim 21, further comprising:
a control circuit connected to said check line sate generator and to said word flag memory, said control circuit being designed for issuing block flags, word flags and control signals used for error correction.

23. Apparatus according to claim 21, further comprising:
a write error detector and crossfade generator connected to said check line generator for generating a crossfade signal.

24. Apparatus according to claim 21 whereas said check line state generator is designed for checking output signals related to erroneous data words and correction word groups to be transmitted to said control circuit and whereas said check line state generator is designed for generating output signals derived from block flags to be transmitted to said write error detector and crossfade generator.

25. Apparatus according to claim 13, further comprising:
a read error detector and fading generator connected to said word flag memory, for generating a muting or fading signal dependent on the word flags issued from the word flag memory.

26. Apparatus according to claim 25, whereas said rear error detector and fading generator comprises:
an adding comparing and selecting circuit;
a generator for threshold output value and increment, connected to said adding, comparing and selecting circuit; and
a counter state memory connected to said adding comparing and selecting circuit, whereas said adding comparing and selecting circuit together with said counter state memory constitute a first and second counter circuit and said adding comparing and selecting circuit issues crossfade signals as well as read instructions for said counter state memory.

* * * * *